United States Patent [19]

Cauge et al.

[11] 4,001,860
[45] Jan. 4, 1977

[54] DOUBLE DIFFUSED METAL OXIDE SEMICONDUCTOR STRUCTURE WITH ISOLATED SOURCE AND DRAIN AND METHOD

[75] Inventors: Thomas P. Cauge, Mountain View; Joseph Kocsis, Sunnyvale, both of Calif.

[73] Assignee: Signetics Corporation, Sunnyvale, Calif.

[22] Filed: Aug. 4, 1975

[21] Appl. No.: 601,355

Related U.S. Application Data

[63] Continuation of Ser. No. 415,110, Nov. 12, 1973, abandoned, which is a continuation of Ser. No. 274,442, July 24, 1972, abandoned, which is a continuation of Ser. No. 89,248, Nov. 13, 1970, abandoned.

[52] U.S. Cl. .................................. 357/23; 357/41; 357/48
[51] Int. Cl.² ........................................ H01L 29/78
[58] Field of Search .................... 357/23, 41, 48

[56] References Cited

UNITED STATES PATENTS

| 3,268,827 | 8/1966 | Carlson et al. ...................... 357/23 |
| 3,315,096 | 4/1967 | Carlson et al. ...................... 357/23 |
| 3,600,642 | 8/1971 | Allison et al. ...................... 357/23 |

*Primary Examiner*—Michael J. Lynch
*Assistant Examiner*—Joseph E. Clawson, Jr.
*Attorney, Agent, or Firm*—Flehr, Hohbach, Test, Albritton & Herbert

[57] ABSTRACT

Metal oxide semiconductor structure having precisely grown channel with the source and drain isolated from each other by a PN junction.

In the method, a double diffusion is carried out through the same opening in an oxide or insulating layer to obtain a very narrow precise channel region with minimum spreading and which can be utilized with a P-type substrate to provide PN isolation between the source and drain.

3 Claims, 6 Drawing Figures

U.S. Patent  Jan. 4, 1977  4,001,860
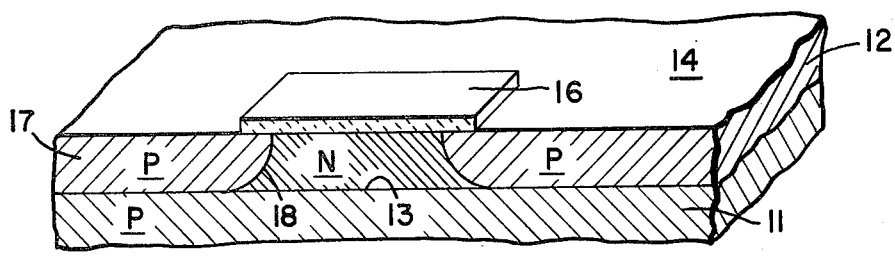
FIG_1
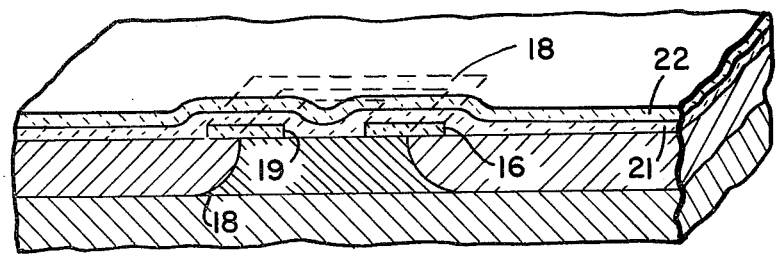
FIG_2
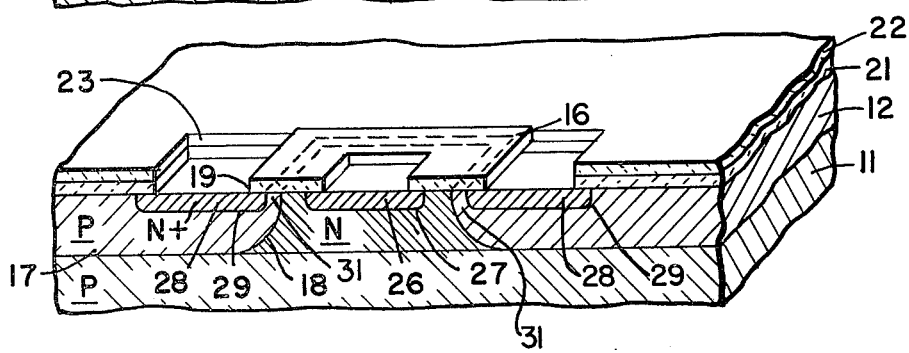
FIG_3
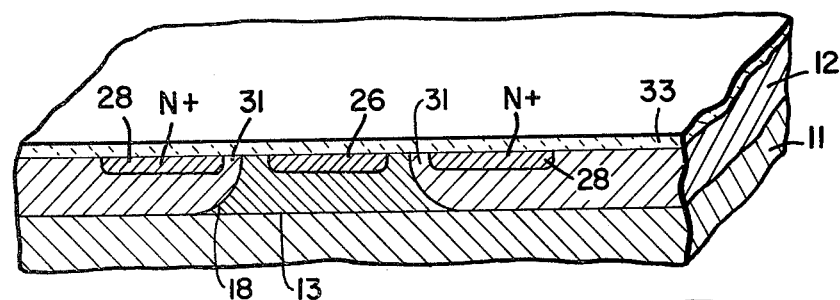
FIG_4
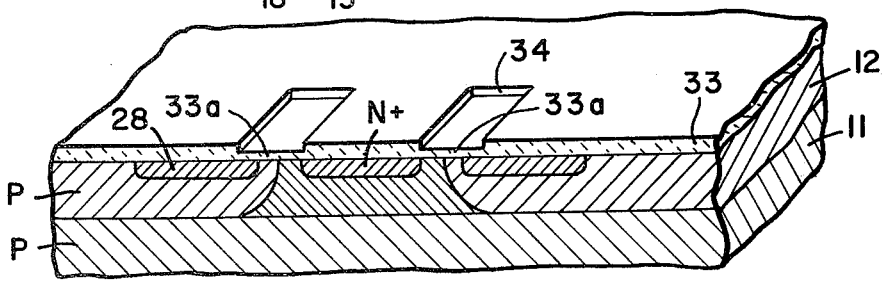
FIG_5
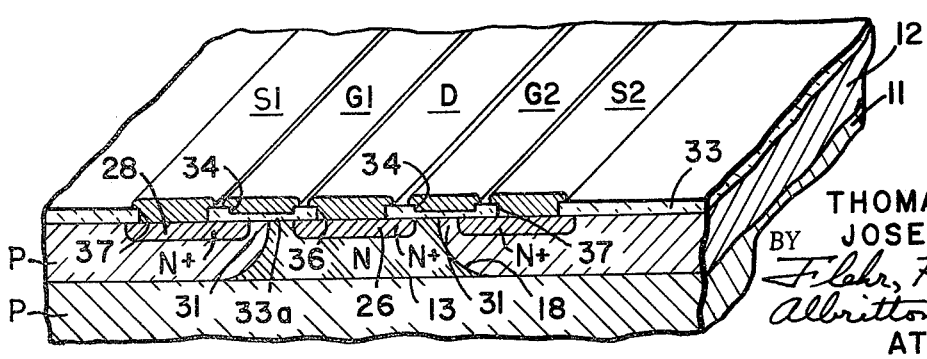
FIG_6
INVENTORS
THOMAS P. CAUGE
JOSEPH KOCSIS
BY Flehr, Hohbach, Test,
Albritton & Herbert
ATTORNEYS

DOUBLE DIFFUSED METAL OXIDE SEMICONDUCTOR STRUCTURE WITH ISOLATED SOURCE AND DRAIN AND METHOD

This is a continuation of application Ser. No. 415,110 filed Nov. 12, 1973, now abandoned, which was a continuation of Ser. No. 274,442, filed July 24, 1972, abandoned, which was a continuation of Ser. No. 89,248, filed Nov. 13, 1970, abandoned.

BACKGROUND OF THE INVENTION

1. Field of the Invention

This invention relates to metal oxide semiconductor structures and more particularly to such structures utilizing double diffusion with isolated source and drain.

2. Description of the Prior Art

In copending application Ser. No. 854,370, filed Sept. 2, 1969, there is disclosed a high voltage high frequency metal oxide semiconductor device and method utilizing double diffusion. However the construction therein disclosed is not particularly adaptable to integrated circuits because the drain was common to the N-type substrate in which the metal oxide semiconductor (hereinafter referred to as MOS) structure was fabricated. In conventional MOS devices, the source and drain are isolated from each other and are isolated from the substrate. However such is not the case when a double diffusion is used for defining the channel. There is therefore a need for an MOS structure and method which would make it possible to provide MOS devices in an integrated circuit that would be isolated from each each other and would still make it possible to utilize the very desirable characteristics of a double diffusion to define the channel.

SUMMARY OF INVENTION AND OBJECTS

The metal oxide semiconductor structure consists of a semiconductor body of one conductivity type with a layer of semiconductor material carried by the semiconductor body having an opposite conductivity type. The layer is provided with a substantially planar surface. A layer of insulating material is formed on the planar surface. A first diffused channel region of said one conductivity type is formed in said layer and is surrounded by a second PN junction which extends from said surface through said layer to said semiconductor body. A second source region is formed in said channel region in said layer of opposite conductivity type and is bounded by a second PN junction which is substantially dish-shaped and extends to the surface. The first and second PN junctions define a channel of precise length. A third diffused region of opposite conductivity type is formed in said layer outside of said channel region and is bounded by a third PN junction which is substantially dish-shaped and extends to the surface. Metallization is provided forming gate, source and drain contacts, with the metallization overlying said layer of insulating material, and making contact through the insulating layer with the second diffused region to provide a source contact and through said third diffused region to provide a drain contact. The metallization also overlies the channel and is separated from the channel by said layer of insulating material to form the gate contact. The source and drain regions are isolated from each other by the first PN junction and by the PN junction between the layer of semiconductor material and the semiconductor body.

In general, it is an object of the present invention to provide a metal oxide semiconductor oxide structure and method in which a double diffusion is utilized and the source and drain are isolated from each other.

Another object of the invention is to provide a structure and method of the above character which is particularly adapted for use in integrated circuits.

Additional objects and features of the invention will appear from the following description in which the preferred embodiment is set forth in detail in conjunction with the accompanying drawing.

BRIEF DESCRIPTION OF THE DRAWING

FIGS. 1 to 6 are partial isometric views partially in cross section showing the method utilized for constructing a metal oxide semiconductor structure incorporating the present invention.

DESCRIPTION OF THE PREFERRED EMBODIMENT

The starting material for making the metal oxide semiconductor structure incorporating the present invention consists of a semiconductor body 11 formed of a suitable material such as silicon which has an impurity of one conductivity type namely a P-type conductivity therein. The semiconductor body or substrate 11 generally has a fairly high resistivity typically between 8 to 16 ohm centimeter. A thin layer 12 formed of a suitable semiconductor material such as silicon is carried by the body 11. The layer 12 can be deposited in an epitaxial reactor and typically has a resistivity of approximately 6 ohm centimeter and may have a thickness ranging from 1 to 3 microns. A first PN junction 13 is formed between the substrate or body 11 and the layer 12. The layer 12 is provided with a planar surface 14 through which diffusions are carried out as hereinafter described.

A layer 16 of a suitable insulating material such as silicon dioxide is provided on the surface 14 and is adherent thereto. The layer 16 can be formed in a suitable manner such as by thermally growing or depositing it so that it is relatively thick as for example 8000 Angstroms.

A first mask (not shown) is provided for defining an area in which the oxide will serve as a mask for subsequent channel and isolation diffusions. This oxide mask is formed by utilizing conventional photolithographic techniques in connection with the first mask and then etching away the undesired oxide so that there is a remainder of the oxide layer 16 as shown in FIG. 1 which will serve as a mask. The oxide mask 16 can have any desired geometry as for example rectangular as shown in the drawing.

After the oxide mask has been formed as shown in FIG. 1, the structure shown in FIG. 1 has an impurity of the one conductivity type, namely the P-type, diffused through the exposed areas of the surface 14 to form a first channel region 17 which extends all the way from the surface 14 down to the semiconductor body 11. This channel region 17 is defined by a second PN junction 18 which extends from the surface 14 down into the semiconductor body 11. As is well known to those skilled in the art, during the time that the impurity is diffusing downwardly, it will diffuse laterally or sideways in a ratio in which the diffusion sideways is approximately two-thirds of the depth of the diffusion.

Thus it can be seen by determining the depth of the diffusion, it is relatively easy to calculate rather precisely the lateral diffusion. Because of the lateral diffusion, the PN junction is curved upwardly and outwardly and extends to the surface below the oxide mask 16 as shown in FIG. 1.

Thereafter as shown in FIG. 2, a second mask (not shown) which is utilized for making the drain contact is used in connection with conventional photolithographic and etching techniques to form a rectangular opening 19 in the remaining oxide mask 16. An oxidenitride sandwich is then formed over the layer 14, over the oxide mask 16 and into the opening or window 19 in the oxide mask. The oxide nitride sandwich is formed in a suitable manner such as by a sequential deposition process. Both can be deposited in a pyrolytic reaction. For example, the silicon nitride layer 21 can be deposited in a conventional silane ammonia reaction at approximately 1000° C to a thickness of approximately 1000 Angstroms. Thereafter, the silicon oxide layer 22 can be deposited to a thickness of approximately 2000 Angstroms so that the combined thickness of the oxide nitride sandwich is approximately 3000 Angstroms. As can be seen from FIG. 2 and as will be noted hereinafter, the silicon nitride completely covers what is going to be the active part of the semiconductor structure.

A third mask (not shown) is then provided which is utilized in conjunction with conventional photolithographic and etching techniques to form openings 23 in the silicon dioxide layer 22 as shown in FIG. 3. Thereafter the exposed silicon nitride layer 21 is also removed with a conventional etch. The oxide layer 22 serves as mask for protecting the silicon nitride layer 21 and therefore permits the openings 23 to be formed all the way down to the surface 14 of the layer 12 and through the opening 19. It can be seen in this manner that the original outline of the oxide mask 16 is still preserved by the utilization of the oxide-nitride sandwich. It can be appreciated that other materials other than the silicon nitride and the silicon dioxide can be utilized. However it is desirable that two materials be utilized in which one layer is attacked selectively by one etch and the other layer is attacked selectively by another etch.

An N-type impurity is then diffused through the openings 23 and 19 to provide the N+ drain region 26 in the N-type material of the layer 12. The region 26 is defined by a dish-shaped junction 27 extending to the surface 14 below the oxide 16. Simultaneously N+ source regions 28 are formed below the window or opening 23 within the channel region 17 and are defined by dish-shaped PN junctions 29 which extends to the surface 14 below the oxide layer 16 and below the silicon nitride layer 21. PN junctions 18 and 29 define channels 31 having a precise length underlying the oxide layer 16. It can be seen that the outer margin of the oxide layer 16 served as the mask for forming the PN junction 18 and also for forming the PN junction 29. Since this outer margin of the oxide layer 16 is unchanged, it is relatively easy to precisely control the lateral dimension of the channels 31 on the surface 14 by controlling the two diffusions which form the regions 17 and 28. Typical channel lengths which can be fabricated in accordance with the present process range from 0.3 microns up to 2.5 microns.

Alternatively the N+ regions 26 and 28 can be formed by depositing a low temperature glass carrying a suitable N type impurity such as phosphorous in the opening 19 and over the mask 16 and the exposed surface 14 after the opening 19 has been formed and before any oxidenitride sandwich has been deposited. A negative of the mask used in FIG. 3 is used for exposing photoresist on the low temperature glass and the undesired low temperature glass is etched away so that there remains low temperature glass in the opening 19 and on the areas of the surface 14 overlying the areas through which the regions 28 are to be formed. The structure is then heated and the low temperature glass acts as a solid diffusion source to form the regions 26 and 28 of the same configuration as shown in FIG. 3. The same edges of the mask 16 are used for the diffusion steps for forming the channels 31 as in the preceding process. The low temperature glass is then etched away and thereafter the mask 16 is removed to provide a surface 14 which is free.

With the oxide-nitride sandwich process, after the N+ diffusion has been carried out as shown in FIG. 3, the silicon dioxide layers 16 and 22 are removed by utilization of a suitable etch and then removing the remaining nitride layer 21 with a conventional nitride etch so that the silicon surface is free or clear.

After the surface 14 is free with either the oxide nitride sandwich process or with the low temperature glass process, a relatively thick layer 33 of a suitable insulating material such as silicon dioxide is formed on the surface 14. This layer can be grown thermally or it can be deposited at a low temperature. Typically, the layer 33 can have a thickness varying from 8000 Angstroms to a micron.

A fourth mask (not shown) is then utilized in conjunction with the conventional photolithographic and etching techniques to open windows or openings 34 in the thick oxide layer 13 to expose the surface 14 overlying the gate region for the semiconductor structure. Thereafter a thin layer 33a of a suitable insulating material such as silicon dioxide is either thermally grown or deposited on the surface 14 in the windows 34 to a typical depth of approximately 1000 Angstroms to form a gate oxide. Typically the width of the gate region would be approximately 8 to 10 microns which would overlie the channel region typically 1 to 2 microns in width.

After the gate oxide has been formed as shown in FIG. 5, a fifth mask (not shown) is utilized in conjunction with conventional photolithographic and etching techniques to provide a drain contact opening 36 and source contact openings 37 in the thick oxide layer 33 to expose the surface 14 overlying the appropriate regions (see FIG. 6). As can be seen, the contact openings 36 and 37 are substantially rectangular as is the opening 34 for the gate. A suitable metal such as aluminum is then evaporated over the entire surface of silicon dioxide layer 33 and into the openings 34, 36 and 37. Thereafter, by the use of a sixth mask (not shown) and conventional photolithographic and etching techniques, the undesired metal is removed so that there remains source contact stripes identified as S1 and S2 making contact with the source regions 28 through the windows 37, gate stripes G1 and G2 overlying the thin gate oxide layer 33a and the channel 31 and a drain stripe D making contact to the drain region by contacting the N+ region 26.

From the semiconductor structure shown in FIG. 6 it can be seen that there has been provided an MOS structure in which the source and drain have been isolated from each other by a PN junction isolation consisting of the junction 18 in combination with the junction 13. This PN junction also serves to isolate the source and drain from the P type substrate 11. This construction makes possible the incorporation of such MOS devices in integrated circuits and the like while at the same time retaining all of the advantages of a double diffusion by utilizing the outer edge of the oxide mask for both diffusion steps. The method utilized is compatible with existing processing techniques.

We claim:

1. In a metal insulator semiconductor structure, a semiconductor body of one conductivity type, an epitaxially grown layer of semiconductor material of uniform thickness ranging from 1–3 microns carried by the semiconductor body and being of opposite conductivity type so that there is a first PN junction between said body and said layer, said layer having a substantially planar surface, a layer of insulating material disposed on said surface, a first diffused region of said one conductivity type formed in and extending through said layer of semiconductor material and being defined by a second PN junction which extends from said surface through said layer of semiconductor material and down to said semiconductor body, said first region surrounding a portion of said layer to define a predetermined region and in such a manner so that said predetermined region gradually increases in width in cross-section as the predetermined region increases in depth and so that the bottom of the predetermined region is defined by said first PN junction and the sides are defined by said second PN junction, said predetermined region underlying a predetermined closed area on said surface, a second region of opposite conductivity type formed in said first region to a depth substantially less than the depth of the first region and being defined by a third PN junction which extends to the surface, said second region being in close proximity to the outer margin of the closed area and extending laterally in a direction away from the predetermined region, said second and third PN junctions serving to define a channel to precise length underlying said predetermined closed area, a third region of opposite conductivity type formed in said predetermined region and extending to said surface in said predetermined region and spaced from said first region, gate metallization disposed on said layer of insulating material and overlying said channel, source contact metallization extending through said layer of insulating material and making contact with said second region, and drain contact metallization extending through said layer of insulating material and making contact with said third region, said source and drain contact metallization being isolated from each other and the semiconductor body by said first and second PN junctions.

2. A structure as in claim 1 wherein said semiconductor body is a form of silicon, said layer of semiconductor material is a form of silicon and wherein said insulating layer is silicon dioxide.

3. A structure as in claim 1 wherein said semiconductor body has a P-type impurity therein and said layer of semiconductor material has an N-type impurity therein.

* * * * *